United States Patent
Wei et al.

(10) Patent No.: US 8,252,388 B2
(45) Date of Patent: Aug. 28, 2012

(54) METHOD AND APPARATUS FOR HIGH RATE, UNIFORM PLASMA PROCESSING OF THREE-DIMENSIONAL OBJECTS

(75) Inventors: Ronghua Wei, San Antonio, TX (US); Chris Rincon, San Antonio, TX (US); Edward Langa, San Antonio, TX (US)

(73) Assignee: Southwest Research Institute, San Antonio, TX (US)

( * ) Notice: Subject to any disclaimer, the term of this patent is extended or adjusted under 35 U.S.C. 154(b) by 976 days.

(21) Appl. No.: 12/121,410

(22) Filed: May 15, 2008

(65) Prior Publication Data

US 2009/0286012 A1 Nov. 19, 2009

(51) Int. Cl.
*B01J 19/08* (2006.01)

(52) U.S. Cl. .......... 427/577; 427/569; 427/570

(58) Field of Classification Search .......... 427/577, 427/569, 570
See application file for complete search history.

(56) References Cited

U.S. PATENT DOCUMENTS

| 5,374,456 A | 12/1994 | Matossian et al. ............ 427/570 |
| 7,608,151 B2 * | 10/2009 | Tudhope et al. .............. 118/715 |

FOREIGN PATENT DOCUMENTS

GB    2420712 A   *  6/2006

* cited by examiner

*Primary Examiner* — Jie Yang
(74) *Attorney, Agent, or Firm* — Chowdhury & Georgakis PC; Ann C Livingston (57) ABSTRACT

A method of performing plasma immersion ion processing (PIIP), particularly suited for processing three-dimensional objects. One or more such objects are placed in a conductive cage having solid or mesh walls. The cage completely encloses the objects. A voltage is applied to the cage, and the plasma is generated, resulting in the plasma being contained within the cage.

16 Claims, 7 Drawing Sheets

| SAMPLE # | AR ION CLEANING | | BOND LAYER | | | COATING | | | | | |
|---|---|---|---|---|---|---|---|---|---|---|---|
| | TIME (MIN) | Vb (KV) | TIME (MIN) | SiH4 FLOW (SCCM) | Vb (KV) | TIME (H) | COATING | GAS | FLOW (SCCM) | Vb (KV) | PEAK CURRENT (A) |
| 1018 STEEL | | | | | | | | | | | |
| CONVENTIONAL PIID | | | | | | | | | | | |
| STANDARD DLC | 60 | 4.7 | 60 | 24 | 4.7 | 10.0 | DLC | C2H2 | 60 | 4.7 | 1 |
| CAGED PIID | | | | | | | | | | | |
| CG-5 | 30 | 4.7 | 30 | 24 | 4.7 | 10.0 | DLC | C2H2 | 60 | 4.7 | 16 |
| CG-6 | 20 | 4.7 | 30 | 24 | 4.7 | 2.0 | DLC | C2H2 | 60 | 4.7 | 10 |
| CG-7 | 20 | 5.6 | 5 | 24 | 5.9 | 2.0 | Si-DLC | C2H2/SiH4 | 50/24 | 6.9 | 1 |
| CG-8 | 20 | 4.7 | 30 | 24 | 4.7 | 2.0 | DLC | C2H2 | 60 | 4.7 | 8 |
| CG-9 | 20 | 4.7 | 30 | 24 | 4.7 | 2.0 | DLC | C2H2 | 60 | 4.7 | 7 |
| CG-10 | 20 | 4.7 | - | - | - | 4.0 | Si-DLC | TMS | 10 | 4.7 | 20 |

FIG. 5

| SAMPLE # | COATING THICKNESS (μm) | DEPOSIT RATE (μm/h) | POLARIZATION RESISTANCE (OHM) | RESULTS EROSION TEST (15 DEG, 10PSI) | EROSION TEST (90 DEG, 5PSI) | EROSION TEST (90 DEG, 10PSI) |
|---|---|---|---|---|---|---|
| 1018 STEEL | | | 1828 | 6.8E-05 | 2.8E-05 | 6.2E-05 |
| CONVENTIONAL PIID | | | | | | |
| STANDARD DLC | 1.4 | 0.14 | 123700 | 3.2E-05 | 2.4E-05 | 4E-05 |
| CAGED PIID | | | | | | |
| CG-5 | 51.0 | 5.10 | 5199 | 6E-06 | 1.2E-05 | 8E-06 |
| CG-6 | 13.0 | 6.50 | 395100 | 4.6E-05 | 2.6E-05 | 1.00E-06 |
| CG-7 | 7.5 | 3.75 | 1265 | | | |
| CG-8 | 5.7 | 2.85 | 23460000 | 5.2E-05 | 1.2E-05 | 4.4E-05 |
| CG-9 | 5.5 | 2.75 | 83660 | 8.2E-05 | 1.00E-06 | 4.6E-05 |
| CG-10 | 7.0 | 1.75 | 12120000 | 2.2E-05 | 6E-06 | 3.6E-05 |

METHOD AND APPARATUS FOR HIGH RATE, UNIFORM PLASMA PROCESSING OF THREE-DIMENSIONAL OBJECTS

TECHNICAL FIELD OF THE INVENTION

This invention relates to deposition of coatings and other surface modifications of various objects, and more particularly to an improved system and method of plasma immersion ion processing for such applications.

BACKGROUND OF THE INVENTION

Plasma immersion ion processing (PIIP) is a surface modification technique based on extracting accelerated ions from a plasma. A high voltage pulsed DC or pure DC power supply is used to target the ions to a surface. The process is applied to both ion deposition (PIID) and ion implantation (PIII).

The plasma can be generated in a suitably designed vacuum chamber and with various plasma sources. Examples of plasma sources are an electron cyclotron resonance plasma source, helicon plasma source, capacitively coupled plasma source, inductively coupled plasma source, DC glow discharge, metal vapor arc (for metallic species), and RF excitation. A pulsed DC glow discharge is commonly used and does not require an external source for plasma generation.

Figure 1:
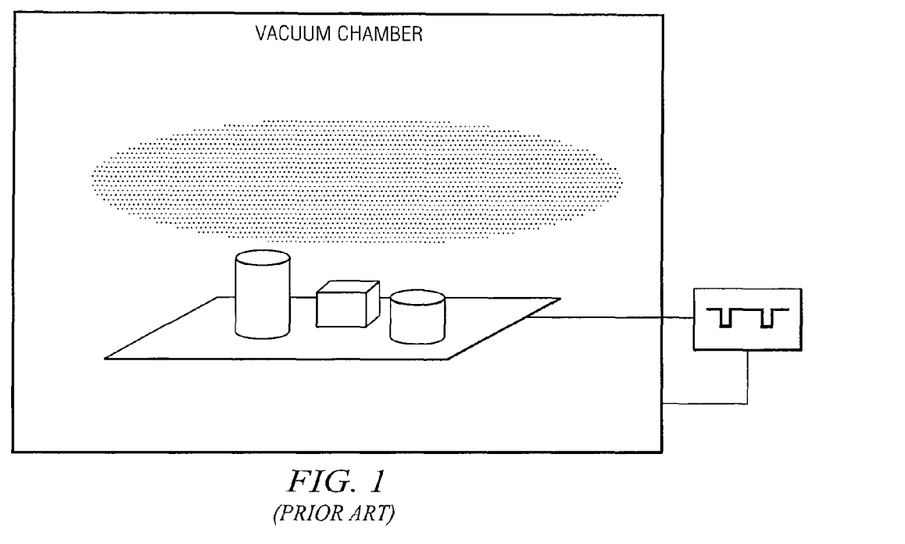
FIG. 1 illustrates a conventional system for plasma immersion ion processing (PIIP) including plasma immersion ion implantation (PIII) and plasma immersion ion deposition (PIID).

FIG. 1 illustrates an example of conventional plasma immersion deposition (PIID) processing, as used to coat the surface of three different workpieces. The workpieces are placed on a metal plate (worktable) in a vacuum chamber. Various apparatus that may be associated with external plasma sources and dopants are not explicitly shown, but are well known in the art of PIIP.

When a high negative voltage is applied to the worktable, at a pressure of a few tens of millitorr, plasma is generated around the workpieces and the worktable. The same voltage also draws positively charged ions from the plasma to the worktable and the surfaces of the workpieces. The impact of the incoming ions also generates electrons (secondary electrons) from the surfaces. These electrons travel to the chamber wall, which is positive with respect to the workpieces, to complete the circuitry.

At a high bias voltage, ions will be implanted into the surfaces. On the other hand, if the ion energy is low, a coating can be deposited on the surface. For example, if acetylene is used as a precursor, diamond-like carbon (DLC) coatings can be deposited.

Electron bombardment is another type of PIIP, but uses polarity opposite to that described above. The result is deposition or implantation of electrons rather than ions.

When the surface to be coated is dielectric, such as in the case of ceramic, glass or polymer materials, the PIII process can be particularly challenging. U.S. Pat. No. 5,374,456 teaches the use of a conductive grid placed conformally over the surface of the object. Other methods have involved placing the object on a metal plate so that ions are drawn to the nonconducting surface of the object as well as to the plate. However, these methods are useful when only one side of the object is to be coated.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION OF THE INVENTION

The following description is directed to plasma immersion ion processing (PIIP) particularly suited for special applications, such as for deposition of three-dimensional coatings. Both conductive and insulating surfaces can be uniformly coated at a high deposition rate.

For purposes of example, this description is in terms of using PIIP to deposit a coating on one or more workpieces. The process is particularly useful for deposition of hard coatings, such as diamond-like carbon (DLC). However, the same concepts apply to other PIIP surface modification processes, such as ion implantation. Thus, the term "PIIP" as used herein includes all types of plasma processing, including without limitation, plasma immersion ion implantation (PIII) and plasma immersion ion deposition (PIID).

Figure 2:
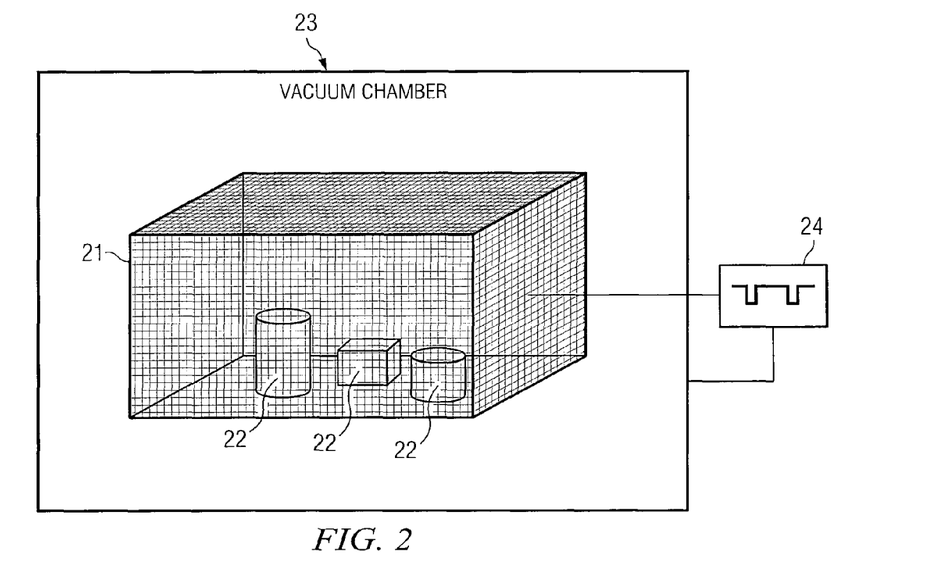
FIG. 2 illustrates "caged" PIIP in accordance with the invention.

FIG. 2 illustrates the use of a cage 21 to enclose multiple three dimensional workpieces 22 (also referred to herein as "parts") in accordance with the invention. The workpieces 22 (or their surfaces to be coated) may be made from any conductive or nonconductive material.

As described above, the process occurs within a vacuum chamber enclosure 23. The enclosure 23 may be a metal container made of metal plates and/or foils, and having at least one area that is open so that gas can fill in the container and electrons can escape from it. A voltage source 24 is connected to the enclosure 23 and the cage 21.

In the example of FIG. 2, cage 21 is made from a metal wire mesh material. As explained below, however, the design of cage 21 may include various degrees of "openness". The PIIP illustrated in FIG. 2 is referred to herein as "caged" PIIP.

When a train of voltage pulses is applied to the cage 21, plasma can be generated inside the cage 21. The pulsed negative voltage also draws ions from all directions to the surfaces of the parts 22. The plasma may be generated by various known techniques, such as those listed in the Background. If argon gas is used, ion sputter cleaning can be accomplished. If a carbonaceous gas such as methane or acetylene is used, a DLC coating can be deposited on the parts 22.

When a metal mesh cage 21 is used, the secondary electrons generated by the ion impact with the parts 22 cannot go to the wall of the vacuum enclosure 23 directly because the secondary electrons will see the negative potential on the cage 21. The electrons are repelled and travel between the part surfaces and the cage. As a result, they experience many more collisions with neutrals, and hence generate more intense plasma than in the conventional PIID process. Eventually the electrons will lose energy and become low energy electrons, which can escape from cage 21 and go to the enclosure wall.

The electron activity described in the preceding paragraph may be compared to a plasma generation process known as hollow cathode discharge (HCD), which generates a plasma inside a tube. In HCD, electrons generated inside the tube cannot escape the tube easily. Therefore, they experience many collisions, and hence a more intense plasma is generated inside the tube.

In the process illustrated in FIG. 2, enhanced electron-neutral collisions greatly increase the plasma density inside the cage 21. As a result, a high deposition rate can be reached.

The process of FIG. 2 also increases the coating uniformity compared to conventional PIID. This can be understood as follows. When a part is placed in plasma, a plasma sheath is formed. The plasma sheath thickness d is proportional to ¾ power of the applied voltage V and inversely proportional to the square root of current density j. This may be expressed mathematically as:

$$d = CV^{3/4} j^{1/2}$$

where C is a constant.

In conventional PIIP processing (FIG. 1), the parts are placed on a table or other work surface, to which voltage is applied. When voltage is applied to the table, it takes a few milliseconds to about a half of a microsecond for the voltage to reach a peak value of about a few kV. The plasma sheath, which starts close to the parts, moves out quickly. As a result, the coating conformality deteriorates.

In the case of the caged PIID process such as that of FIG. 2, experimentation has established that the plasma is confined inside the cage 21. The potential is only a few eV above the parts throughout the application of the voltage. Hence the plasma sheath is very small (conformal). Moreover, in the caged PIIP process, the plasma density is much higher than that produced by the conventional PIID process. Therefore, the current density j to the parts is much higher, leading to a smaller sheath dimension or more conformal deposition.

Figure 3:
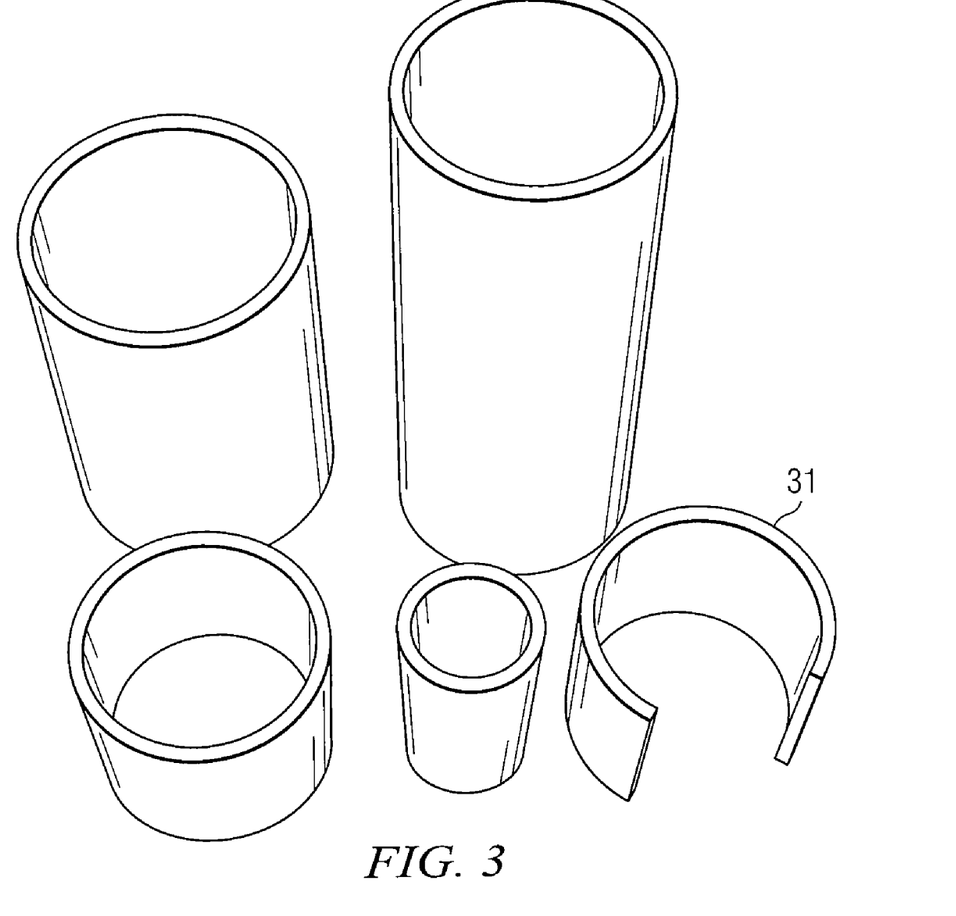
FIG. 3 illustrates three dimensional parts having both inner and outer surfaces, coated in accordance with caged PIIP.

FIG. 3 illustrates examples of three dimensional parts having exposed inner and outer surfaces. The caged PIIP is particularly useful with this type of workpiece, as compared to workpieces that are closed shapes and have only outer surfaces. For example, a semi-cylindrical part 31 has an inner surface, an outer surface, and edge surfaces. By using caged PIIP, all surfaces of the parts illustrated in FIG. 3 are uniformly coated, inside and out, in a single processing step. In other words, neither the parts nor the cage need be repositioned within the vacuum chamber during the deposition process.

As another example, a rubber tube or rubber-coated wire has a cylindrical surface and the process may be used to coat the entire surface area. Another example of an object easily coated with caged PIIP is gears.

In a most general sense, any three-dimensional object may be considered to have a three-dimensional surface, and the process of FIG. 2 results in all surfaces being treated simultaneously. By "all surfaces" is meant all surfaces that are not covered by whatever means is used to support or suspend the object within cage 21.

Referring again to FIG. 2, although the parts 22 are shown resting on the bottom of the cage 21, they may be easily suspended or supported so that virtually every surface of each part can be coated.

As stated above, in the example of FIG. 2, cage 21 is a metal meshed cage. An example of a suitable mesh size is 3 mm. The cage 21 completely encloses the parts, and does not touch the part surfaces except at the support areas.

The openness of the mesh of cage 21 can vary from near 0 to as much as 90%. A "0" opening size results in the cage being a tube, box, or other container with solid walls. In this case, the cage 21 need only have one or two openings to admit gas or permit electrons to exit.

The shape of cage 21 need not conform to any surface of the parts being processed. A large volume cage 21, relative to the size of the parts, permits a high density plasma to be achieved because the secondary electrons will have many collisions inside the cage. A typical distance between the parts and the sides of cage 21 is two inches or more. The choice of size of cage 21 relative to the workpiece(s) may involve design choices to achieve both desired uniformity and desired plasma density, depending on the application and type of surface to be coated. It is also possible for the cage to have any combination of solid walls and mesh walls with varying degrees of openness.

In operation, an example of a method for plasma processing has an initial step of evacuating vacuum chamber to a pressure of at least $10^{-5}$ Torr. The chamber is then fed with desired gas precursors such as Ar, He and $C_2H_2$. The plasma is generated using negative voltage pulses to the cage 21. Typical operating parameters are: frequency—500 Hz, pulse width—20 μsec, voltage—4 kV.

The surfaces may be ion cleaned using Ar, He or $H_2$. A bond layer coating may be deposited, if necessary, on the surfaces using $SiH_4$ or TMS (trimethylsilane). This is followed by depositing a desired coating such as a DLC coating on the surfaces using $CH_4$, $C_2H_2$, $SiH_4$, TMS (trimethylsilane) or their mixture. Other coatings may be deposited using Cr-containing gases such as hexacarbonyl chromium (Cr $(CO)_6$), or Ti-containing gases such as Tetrakis titanium (Ti $[N(CH_3)_2]_4$).

Figure 4A:
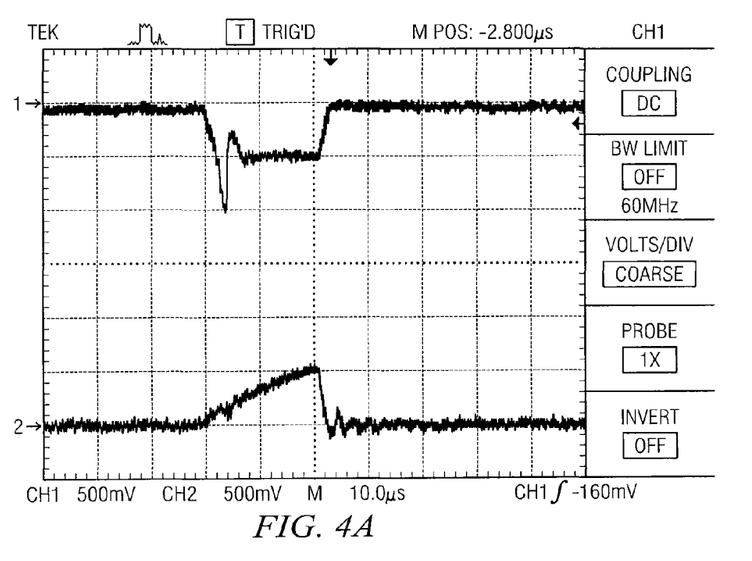
FIG. 4A illustrates voltage and current waveforms associated with the caged PIIP.
Figure 4B:
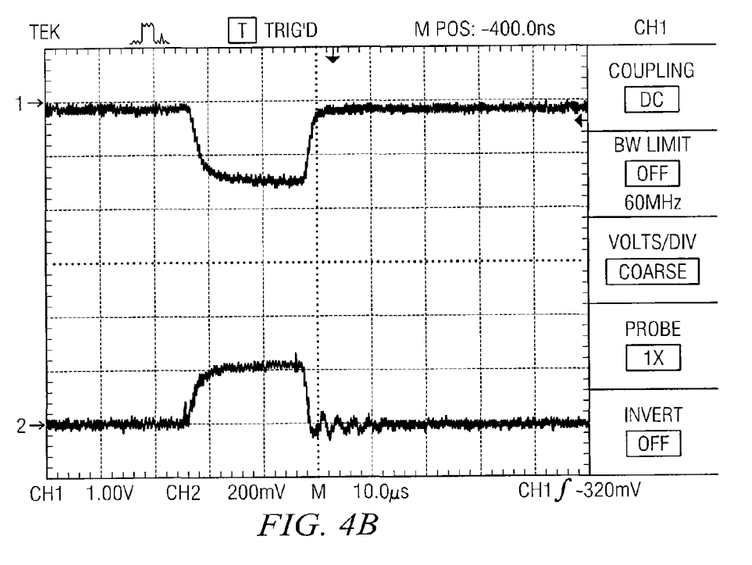
FIG. 4B illustrates voltage and current waveforms associated with conventional PIIP.

FIG. 4A illustrates typical voltage (top) and current (bottom) waveforms of the caged PIID process. One volt for the voltage traces on the depicted oscilloscope equals 2 kV, while one volt on the current traces equals to 10 A. The increase of current with time is similar to characteristics of hollow cathode discharge. FIG. 4B illustrates voltage and current for conventional PIID. Comparing FIGS. 4A and 4B shows that the peak current for caged PIID is generally much higher than that of conventional PIID.

Figure 5:
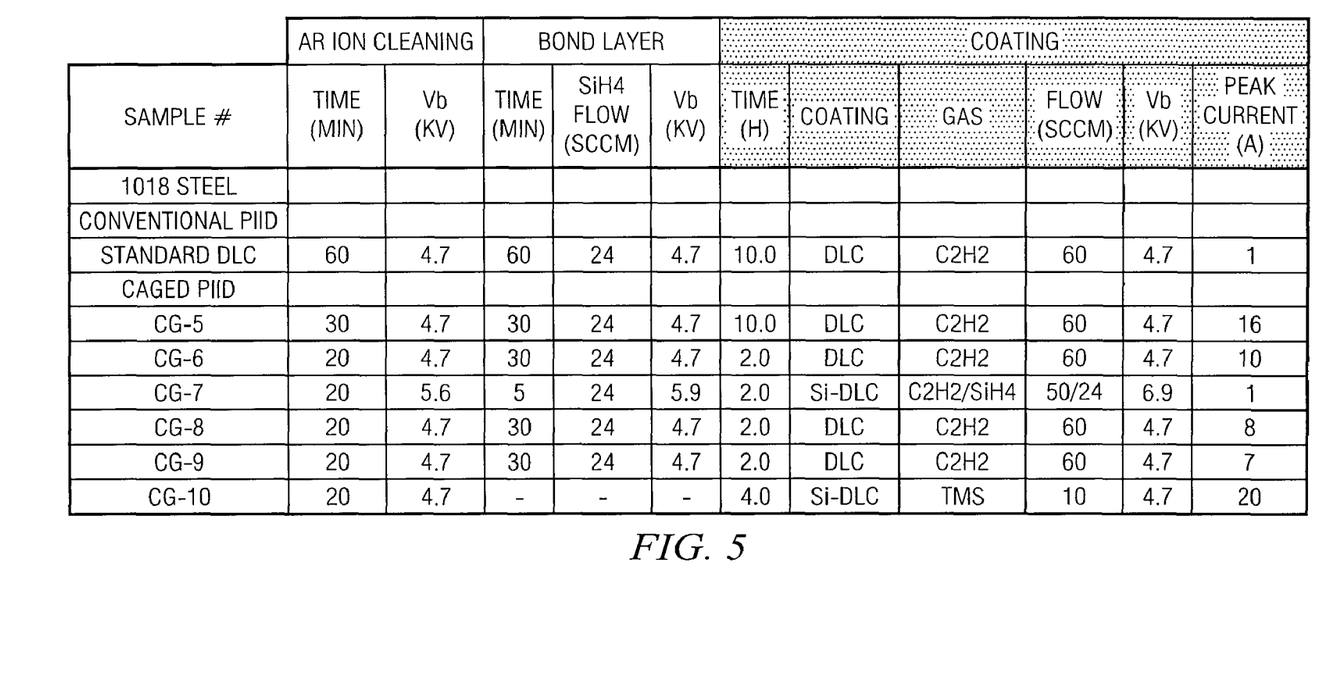
FIG. 5 is a table of various material samples and parameters for applying coatings to their surfaces, using both conventional and caged PIIP.

FIG. 5 is a table of samples of steel objects, with the first sample being processed using conventional PIID and six additional samples being processed with caged PIID as described herein. AISI 1018 carbon steel was used as the surface to be coated. A standard DLC coating was performed using the conventional PIID process as the baseline. Then a number of tests were conducted using the caged PIID process.

Column 1 lists the sample number. Columns 2 and 3 list the ion cleaning duration and bias voltage for each sample, for removal of surface oxide. Columns 4-6 list the bond layer deposition parameters. An Si layer (using an SiH4 precursor) is commonly used to increase the adhesion of the subsequent DLC coating to steel substrates. Columns 7-12 list deposition parameters. As can be seen, acetylene (C2H2) is usually used to form DLC, while Si+C2H2 and TMS (trimethylsilane) are used to form Si-containing DLC for various purposes. The last column of the table of FIG. 5 lists the peak current for the conventional PIID and the caged PIID processes. Clearly, a much higher current can be drawn from the caged PIID process. As a result, a much higher deposition rate can be achieved.

Figure 6:
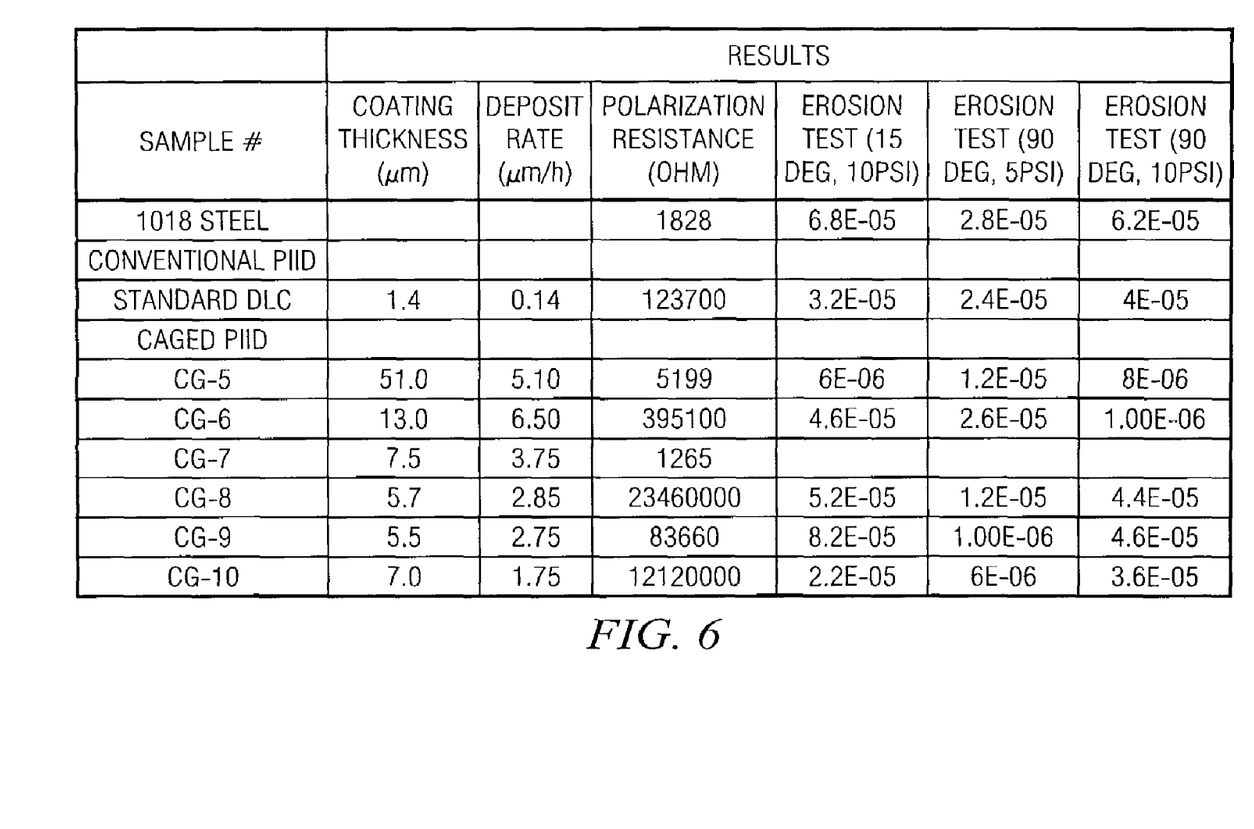
FIG. 6 is a table of the samples of FIG. 5 and the results of the PIID processing.

FIG. 6 illustrates the experimental results from analysis of the samples processed in accordance with FIG. 5. The coating thickness is listed in Column 2, while the deposition rate is listed in Column 3. As can be seen, the deposition rate for all samples using the caged PIID process is much higher than that used for conventional PIID of a DLC coating.

Figure 7:
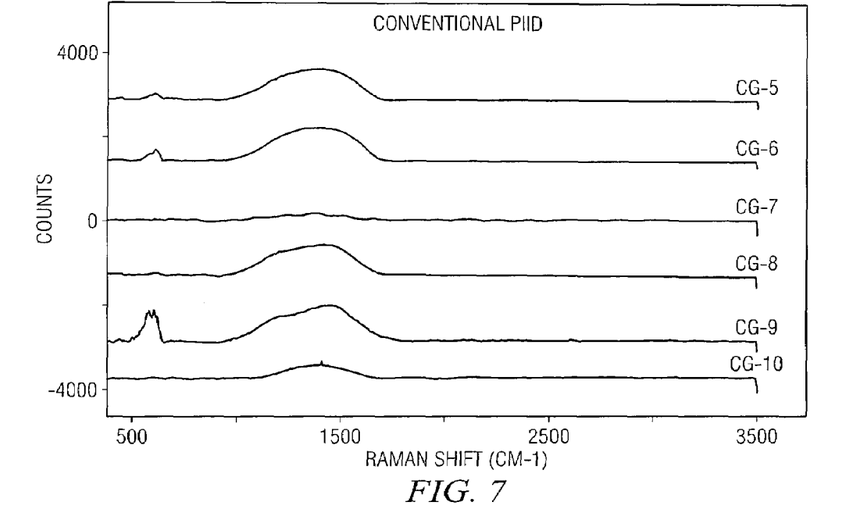
FIG. 7 illustrates analysis of the PIID processed samples of FIG. 5, using Raman spectroscopy to measure DLC coatings.

FIG. 7 illustrates the results of analyzing the DLC coatings of the samples of FIG. 5, using Raman spectroscopy. All samples, except CG7, show the characteristics of DLC films.

Figure 8:
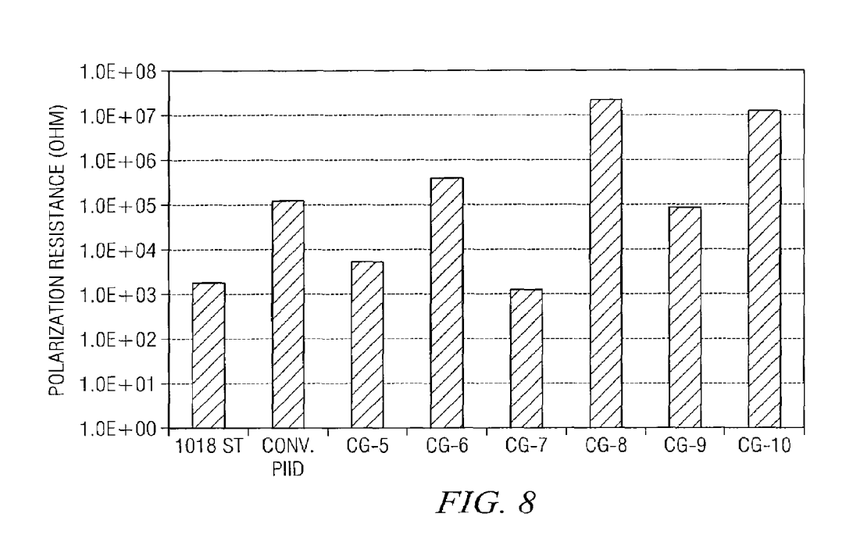
FIG. 8 illustrates analysis of the PIID processed samples of FIG. 5, using polarization testing.

FIG. 8 illustrates the results of evaluating the corrosion resistance of the deposited samples, using a using a polarization test. This data is also listed in Column 4 of FIG. 6. The higher the resistance, the better the corrosion resistance. As can be seen, Samples CG-6, CG-8 and CG10 have much higher corrosion resistance than the conventionally deposited DLC.

Figure 9:
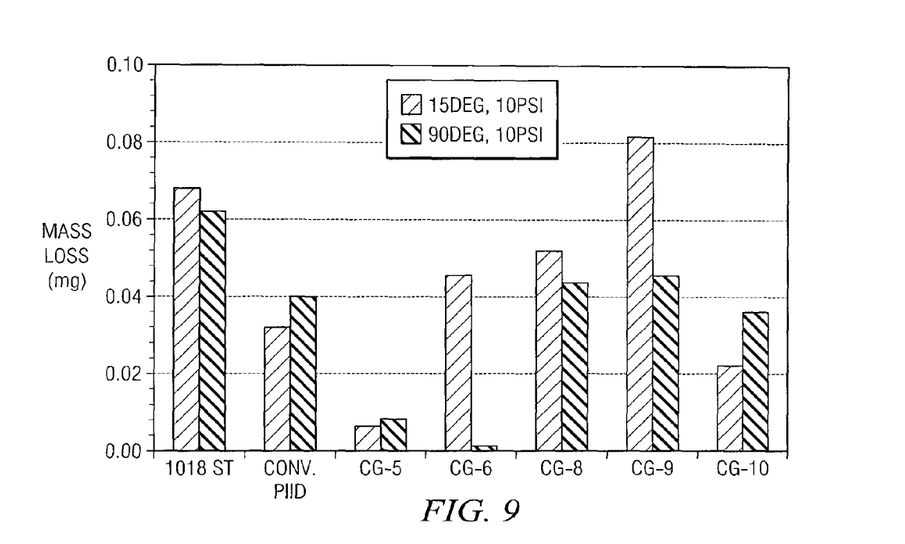
FIG. 9 illustrates analysis of the PIID processed samples of FIG. 5, using erosion testing.

FIG. 9 is a plot of erosion data for each of the coated samples. The coated samples were erosion tested using 50 μm alumina at 15 degree and 90 degree incidences at two pressures of 5 psi and 10 psi. This results of the testing is also listed in Column 5 of FIG. 6. As can be seen, most samples outperform uncoated 1018 steel while some samples outperform the conventionally deposited DLC.

The above-described process is useful for coating nonconductive (dielectric) surfaces, as well as conductive surfaces. For such materials, the cleaning step described above may be followed by one or more surface-functionalizing steps, such as functionalizing surfaces using Ar, He, $N_2$, $O_2$ or $H_2$ for increased surface energy, or functionalizing surfaces using fluorine-containing gas such as $C_3F_8$ or $C_2F_6$ for decreased surface energy. For some applications, such as for treating Teflon, the PIIP may be performed to increase surface energy so that it can be bonded to other materials. The functionalizing steps may then be followed by one or more deposition steps, such as are described above.

Figure 10:
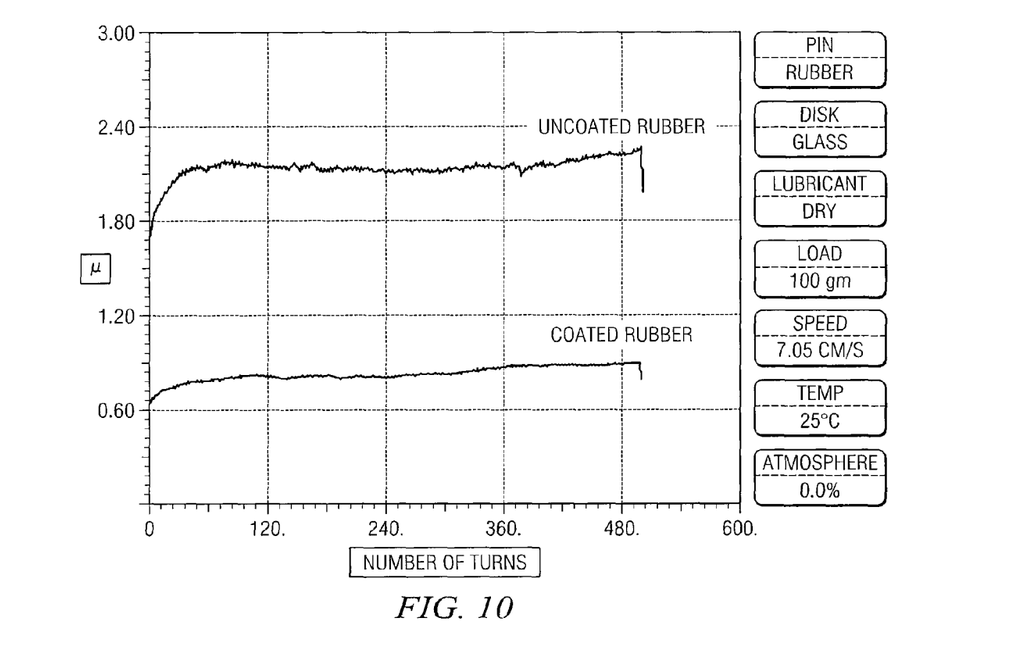
FIG. 10 illustrates results from experimental DLC coatings applied to sections of rubber materials, using the caged PIID process.

FIG. 10 illustrates results from experimental DLC coatings applied to sections of rubber materials, using the caged PIID process. Such coatings are often used to reduce friction, and FIG. 10 shows the friction data. As can be seen, without coating, the coefficient of friction of the rubber against glass was about 2.1-2.2. In contrast, for DLC coated rubber, the coefficient of friction decreased to 0.7-0.8. The deposition parameters were: 15 min Ar sputtering, 4 hrs $C_2H_2$ coating, 500 Hz, 20 μs pulse width, and 4.1 kV bias. The friction test was performed with an 8 mm radius and 100 gm load with a glass counterface.

Another application of caged PIIP is the deposition of DLC coatings on glass and polycarbonate for increased erosion and abrasion resistance. Large curved work pieces can be deposited uniformly on both sides, if needed, or on one side when covering the other side. These DLC coated work pieces can be used for windshields of automobiles, military vehicles, aircraft and helicopters, and chin bubbles of helicopters. Because DLC is more erosion resistant and more hydrophobic than glass or polycarbonate, a thin layer of the DLC coating can greatly increase the durability and combat readiness of the windshields and chin bubbles. To increase the hydrophobicity, fluorine-containing (such as $C_3F_8$) or silicon-containing (such as $SiH_4$) gas precursors may be added in addition to the hydrocarbon gases such as acetylene ($C_2H_2$) or methane ($CH_4$). Other precursors such as hexamethyldisiloxane (HMDSO) and trimethylsilane (TMS) may be used to achieve higher hydrophobicity than regular DLC obtained from $C_2H_2$ or $CH_4$. For these applications, caged PIIP provides uniform coating on large curved surfaces. A high deposition rate may be of less concern.

What is claimed is:

1. A method of plasma processing one or more three-dimensional objects simultaneously, the one or more objects having their surfaces made from any conductive or nonconductive material, comprising:
   placing the one or more objects within a vacuum chamber of the type used for plasma processing;
   enclosing the objects in a conductive cage that completely surrounds the object and is displaced from all surfaces of the objects and no surface of the object rests on the cage;
   suspending or supporting the objects within the cage such that all surfaces of the object may be processed simultaneously; and
   plasma processing the objects, such that a bias voltage is applied to the cage and such that all open surfaces of the objects are processed;
   wherein the cage has a predetermined size relative to the objects such that a desired plasma sheath thickness is achieved inside the cage.

2. The method of claim 1, wherein the objects have both inner and outer surfaces, and wherein the plasma processing modifies the both the inner and outer surfaces.

3. The method of claim 1, wherein the plasma processing is a plasma immersion ion deposition process.

4. The method of claim 1, wherein the plasma processing is a plasma immersion ion implantation process.

5. The method of claim 1, wherein the cage is a metal mesh cage.

6. The method of claim 1, wherein the cage has at least one solid-wall.

7. The method of claim 1, wherein the voltage is a pulsed DC voltage.

8. The method of claim 1, wherein the plasma processing is performed such that the plasma is contained within the cage.

9. The method of claim 1, wherein the objects have rubber surfaces and the plasma processing is a plasma immersion ion deposition process for depositing a diamond-like carbon coating.

10. A method of performing a plasma immersion ion deposition process to coat the surfaces of one or more three-dimensional objects simultaneously, the one or more objects having their surfaces made from a nonconductive material, comprising:
    placing the one or more objects within a vacuum chamber of the type used for plasma processing;
    enclosing the objects in a conductive cage that completely surrounds the object and is displaced from all surfaces of the object and no surface of the object rests on the cage;
    suspending or supporting the objects within the cage such that all surfaces of the object may be processed simultaneously;
    wherein the cage has a predetermined size relative to the objects such that a desired plasma sheath thickness is achieved inside the cage; and
    plasma processing the objects, such that a bias voltage is applied to the cage;
    wherein the plasma processing coats all open surfaces of the one or more objects;
    wherein the plasma processing is performed with at least the following steps: ion cleaning the surfaces, increasing or decreasing the surface energy of the surfaces, depositing a coating on the surfaces using at least one of the following gases: methane, acetylene, silane, trimethylsilane, chromium-containing gases, or titanium-containing gases.

11. The method of claim 10, wherein the cage is a metal mesh cage.

12. The method of claim 10, wherein the cage has at least one solid-wall.

13. The method of claim 10, wherein the voltage is a pulsed DC voltage.

14. The method of claim 10, wherein the nonconductive material is rubber and the plasma processing deposits a diamond-like carbon coating on the objects.

15. The method of claim 10, wherein the nonconductive material is glass or polycarbonate in the form of a curved windshield.

16. The method of claim 10 wherein the surface energy is increased using one of the following gases: argon, helium, nitrogen, oxygen or hydrogen.

* * * * *